United States Patent
Clingman et al.

(10) Patent No.: US 7,541,720 B2
(45) Date of Patent: Jun. 2, 2009

(54) ENERGY HARVESTING APPARATUS AND METHOD

(75) Inventors: Dan J. Clingman, Auburn, WA (US); Mark W. Herrin, Desmoines, WA (US)

(73) Assignee: The Boeing Company, Chicago, IL (US)

( * ) Notice: Subject to any disclaimer, the term of this patent is extended or adjusted under 35 U.S.C. 154(b) by 100 days.

(21) Appl. No.: 11/613,893

(22) Filed: Dec. 20, 2006

(65) Prior Publication Data

US 2008/0150396 A1 Jun. 26, 2008

(51) Int. Cl.
*H01L 41/113* (2006.01)

(52) U.S. Cl. .................. 310/339; 310/329

(58) Field of Classification Search ........... 310/329, 310/339, 328, 330–332
See application file for complete search history.

(56) References Cited

U.S. PATENT DOCUMENTS

| | | | |
|---|---|---|---|
| 5,389,850 A | 2/1995 | Wilmer | |
| 6,252,336 B1 * | 6/2001 | Hall | 310/339 |
| 6,858,970 B2 | 2/2005 | Malkin et al. | |
| 6,894,460 B2 | 5/2005 | Clingman et al. | |
| 2006/0175937 A1 | 8/2006 | Clingman et al. | |
| 2006/0202592 A1 | 9/2006 | Ruggeri et al. | |
| 2007/0145861 A1 * | 6/2007 | Tanner | 310/339 |

* cited by examiner

*Primary Examiner*—Quyen P Leung
*Assistant Examiner*—Derek J Rosenau
(74) *Attorney, Agent, or Firm*—Harness, Dickey & Pierce, P.L.C.

(57) ABSTRACT

An energy harvesting apparatus and method. In one form the apparatus makes use of a pair of flexible beams that are supported at first ends thereof from a base. Second ends of each of the beams are operatively coupled to rigid links. The rigid links are in turn operatively coupled to a mass component that is free to move linearly in a path generally parallel to the longitudinal axes of the flexible beams. Movement of the mass component in response to vibration forces causes a twisting moment to be applied at the second end of each flexible beam. This causes a uniform flexing of each of the flexible beams. A piezoceramic material layer on each beam generates electrical signals in response to the flexing motion of the beam.

12 Claims, 6 Drawing Sheets

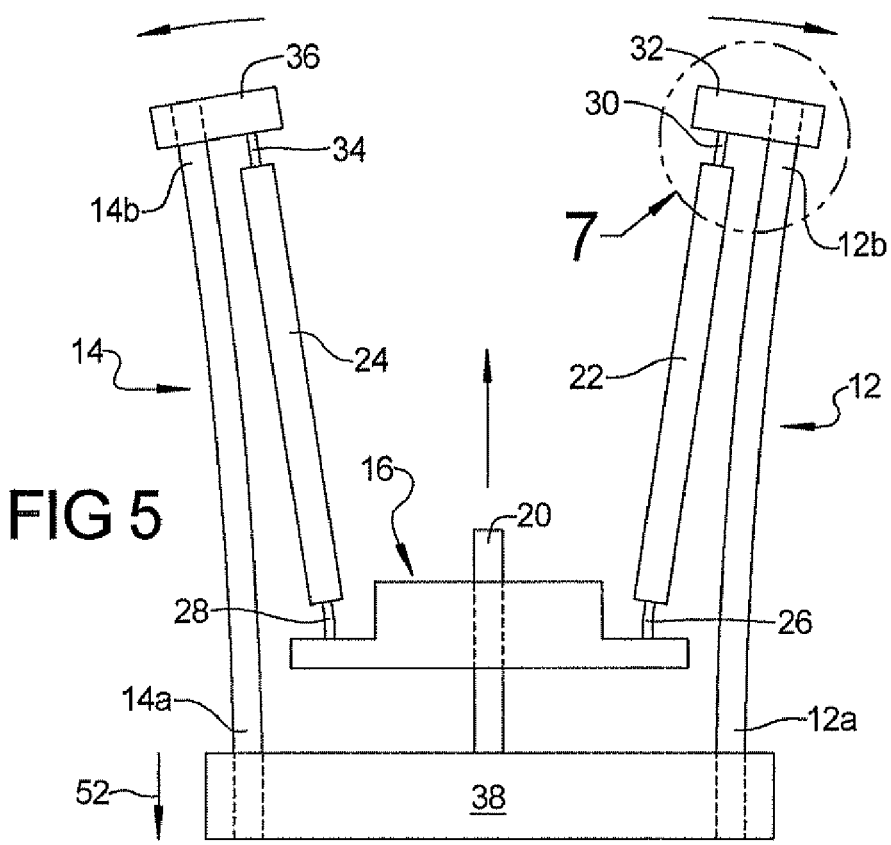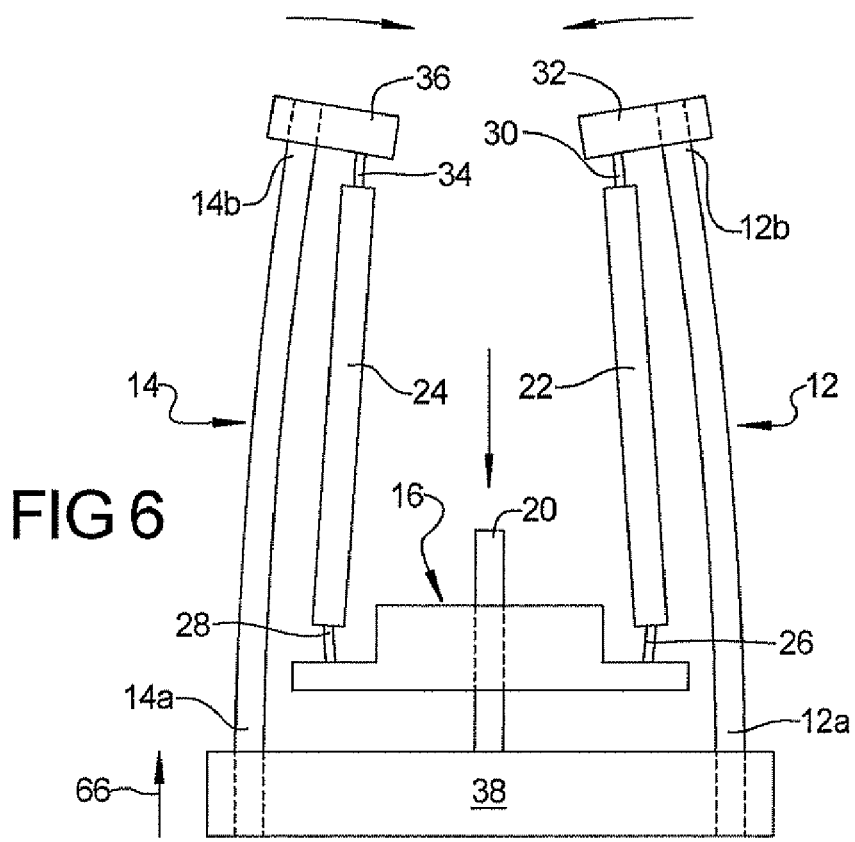

ENERGY HARVESTING APPARATUS AND METHOD

CROSS-REFERENCE TO RELATED APPLICATIONS

The present application is related in general subject matter to U.S. patent application Ser. No. 11/613,902 filed concurrently herewith, and incorporated by reference into the present application.

FIELD

The present disclosure relates to energy harvesting apparatuses and methods, and more particularly to energy harvesting apparatuses and methods that involve the use of one or more flexible beams for generating electrical signals in response to vibration energy.

BACKGROUND

The statements in this section merely provide background information related to the present disclosure and may not constitute prior art.

There is increasing interest in the use of energy harvesting apparatuses and methods for harvesting vibration energy experienced by various forms of mobile platforms, for example, spacecraft, aircraft, and automotive vehicles. Energy harvesting apparatuses and methods can be used to harvest vibration energy for the purpose of generating electrical signals to power various forms of sensors or actuators, or to control other electronic or electromechanical devices.

Previously developed vibration harvesting devices often make use of a cantilever beam. The cantilever beam is fixedly supported from a support structure at a first end, where the first structure experiences vibration energy. A second end of the cantilever beam is free to move in response to the vibration energy experienced by the beam. The vibration energy typically forms a force that is applied along an axis that is directed perpendicular to the longitudinal length of the beam at the outermost tip of the beam (i.e., in this example the second end of the beam), as indicated in FIG. 1. When such a perpendicularly directed force is applied to the beam, typically the stress and/or strain experienced by the beam is greatest at the root area of the beam (i.e., the area where the beam is secured to the support structure) when the beam flexes into the dashed position shown in FIG. 1. For example, if the beam comprises a piezoceramic material, the energy distribution within the piezoceramic material may look similar to what is disclosed in FIG. 2. FIG. 2 illustrates that the majority of the piezoceramic energy developed during flexing of the beam occurs at the root area of the beam. Thus, a majority of the length of the beam produces only a small amount of energy as the beam is deflected. This characteristic thus tends to limit the efficiency of the piezoceramic material of the beam in generating electrical energy during flexing movement of the beam.

Accordingly, it would be highly desirable to provide an energy harvesting apparatus which is able to even more efficiently and effectively generate electrical signals in response to vibration energy.

SUMMARY

The present disclosure relates to an energy harvesting apparatus and method that even more efficiently and effectively harvests vibration energy generated by a vibrating structure. In one embodiment the apparatus may include a flexible beam that is supported at a first end from a support structure, with a second end that is free to move. The flexible beam includes a material which is response to changing levels of stress and/or strain to generate electrical signals in response to flexing movement of the flexible beam. A moment generating subsystem is responsive to vibration energy from a vibrating structure and is in communication with the flexible beam.

The moment generating subsystem operates to apply a twisting moment adjacent the second portion of the beam in response to vibration energy experienced by the apparatus. The twisting moment causes flexing of the flexible beam, which in turn causes changing levels of stress and/or strain with the beam. The changing levels or stress and/or strain cause the flexible beam to generate electrical signals. The twisting moment applied adjacent the second portion of the beam enables the stress and/or strain to be distributed more uniformly over a majority of the length of the beam, rather than being concentrated at the fixed end of the flexible beam.

In one embodiment the moment generating subsystem includes a mass component which is supported for generally linear, sliding movement in response to vibration energy. A link interposed between the mass component and the flexible beam transmits motion of the mass component to the flexible beam in a manner that generates the twisting moment at the second portion of the flexible beam.

In another embodiment a pair of flexible beams are secured at first portions thereof, while a second portion of each flexible beam is free to move. A moment generating subsystem applies twisting moments to second portions of each of the flexible beams in response to vibration energy. Each flexible beam includes a material which is electrically responsive to changing levels of stress and/or strain. The twisting moment supplied to each of the flexible beams causes each to generate electrical signals.

In one specific embodiment a flexible beam is employed that includes a piezoceramic material layer. The piezoceramic material layer experiences changes in stress and/or strain as the flexible beam flexes, and generates electrical output signals in response thereto. In one embodiment a pair of flexible beams, each including a piezoceramic material layer, are included.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 5 is an illustration of the flexing motion of the flexible beams in response to twisting moments applied at the outermost end of each of the flexible beams, in response to vibration experienced by a mass component that cause the mass component to move upwardly;

FIG. 6 is a view of the apparatus illustrating the flexing motion of the two flexible beams as the mass component moves in a downward direction;

DETAILED DESCRIPTION

Figure 1:
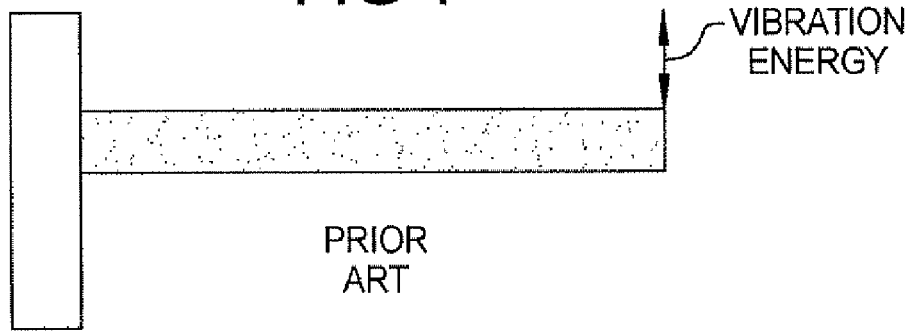
FIG. 1 is a side view of a prior art piezoceramic beam illustrating a force being applied at an outermost, tip portion of the beam, with the resulting deflection of the beam being illustrated in dashed lines.

The following description is merely exemplary in nature and is not intended to limit the present disclosure, application, or uses. It should be understood that throughout the drawings, corresponding reference numerals indicate like or corresponding parts and features.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

Figure 3:
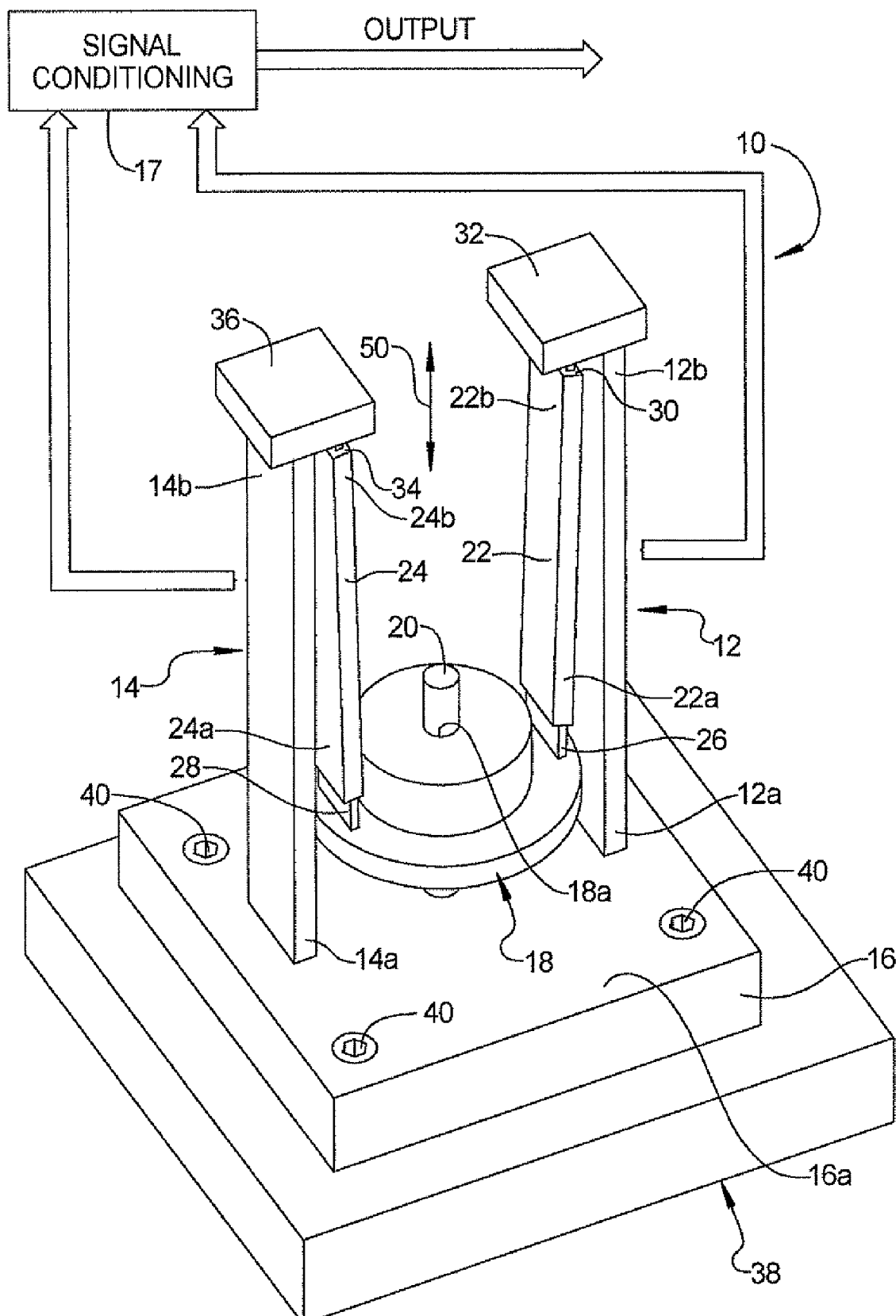
FIG. 3 is a perspective view of an energy harvesting apparatus in accordance with one embodiment of the present disclosure.

Referring to FIG. 3, an energy harvesting apparatus 10 is shown in accordance with one embodiment of the present disclosure. The apparatus 10 includes at least one flexible beam 12, and in this example a pair of flexible beams 12,14. Each of the flexible beams 12,14 is secured at a first end 12a and 14a, respectively to a base 16. The flexible beams 12,14 are also in electrical communication with a signal conditioning subsystem 17 that receives the electrical output signals from the flexible beams 12,14, as will be described in greater detail in the following paragraphs.

Supported for linear sliding movement on the base 16 is a mass component 18 that is guided by a rod 20 fixedly securely to the base 16 and extending generally parallel to the longitudinal axes of the flexible beams 12,14. The mass component 18 includes an opening 18a which receives the rod 20. A pair of rigid links 22 and 24 communicate motion of the mass. component 18 to each of the flexible beams 12 and 14. Rigid link 22 includes a flexure 26 that connects a lower end 22a of the link 22 to the mass component 18. Similarly, rigid link 24 includes a flexure element 28 that connects the mass component 18 to a lower end 24a of the rigid link 24.

Rigid link 22 includes an upper end 22b that is coupled to a flexure 30, which is in turn coupled to a coupling element 32. The coupling element 32 is fixedly coupled to an upper end 12b of the flexible beam 12. Upper end 12b can be viewed as the "free end" of the flexible beam 12 because it is free to move in space, as compared to lower end 12a, which is fixed to the base 16. Rigid link 24 similarly includes an upper end 24b having a flexure 34 that secures the upper end 24b to a coupling element 36. The coupling element 36 is in turn fixedly secured to an upper end 14b of the flexible beam 14. The combination of the mass component 18, rigid links 22 and 24, flexures 26, 28, 30 and 34, and coupling elements 32 and 36, can collectively be viewed as a moment generating subsystem The function of the moment generating subsystem will be described in detail momentarily.

With further reference to FIG. 3, the lower ends 12a and 14a of the flexible beams 12 and 14, respectively, may be secured in any suitable manner to the base 16. For example, the lower ends 12a and 14a may be inserted into blind recesses formed in the base 16 and secured therein by suitable adhesives, by set screws or any other suitable means. The upper ends 12b and 14b may extend through comparably shaped openings in the coupling components 32 and 36, and may be secured to the coupling components 32 and 36 by adhesives, by set screws, or by any suitable alternative structure. The flexure elements 26, 28, 30 and 34 may similarly be secured to the mass component 18 and the coupling elements 32 and 36, for example, by inserting end portions into blind recesses or holes, and using adhesives, set screws or any other securing implements. The base 16 is secured to a vibrating structure 38, in this example, by a plurality of threaded fasteners 40. However, adhesives, clamps or any other suitable structure or device could be employed to hold the base 16 securely to the structure 38.

The links 22 may be made from any material that is resistant to flexing and bending. Suitable materials may include aluminum, steel, or high strength plastics. The flexures 26, 28, 30 and 34 may be formed from relatively thin sections of spring steel or any other suitable material that is able to flex slightly. In one form, the flexures 26, 28, 30 and 34 are formed by spring steel material having a thickness in the range of between 0.003 inch-0.0003 inch (0.0762 mm-0.00762 mm). The coupling elements 32 and 36 may be formed from aluminum, high strength plastic, steel or any other suitable material able to generate a twisting moment on its associated flexible beam (12 or 14).

The structure 38 may form a portion of a non-mobile structure or a mobile platform. It is anticipated that the apparatus 10 will find particular utility in connection with airborne mobile platforms such as manned and unmanned spacecraft, on commercial and military aircraft, and on automotive vehicles such as cars, trucks, vans, busses, etc. Other potential applications include use on marine vessels.

Figure 4:
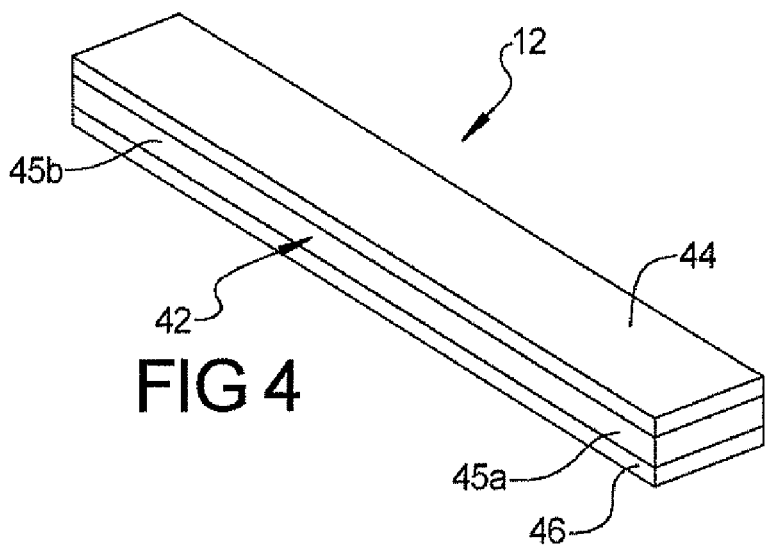
FIG. 4 is an illustration of one of the flexible beams illustrated in FIG. 3.

Referring to FIG. 4, flexible beam 12 is shown in greater detail. The flexible beam 12, in this example, is identical in construction to flexible beam 14. The flexible beam 12 includes a support substrate 42 with a pair of stress and strain responsive material layers 44 and 46 secured to opposite surfaces thereof. In one embodiment the support substrate 42 may be formed from spring steel, a conductive carbon composite, or any other conductive resilient material that is capable of flexing without breakage or fracturing. The stress and strain responsive material layers 44 and 46 may comprise piezoceramic material layers, Piezo fiber composite material layers or (piezopolymer polyvinylidene fluoride (PVDF)). For convenience, material layers 44 and 46 will be referred to throughout the following discussion is "piezoceramic" material layers 44 and 46 Using a conductive material for the support substrate provides the advantage that the electrical signals from the two piezoceramic material layers 44, 46 can be added. This is provided that the piezoceramic materials used for the layers 44, 46 are each polled during manufacture such that one will generate a positive polarity voltage when placed under tension, while the other will generate a positive voltage when placed under compression.

The piezoceramic material layers 44 and 46 may be secured to the substrate 42 by adhesives, by clamping elements, or any other suitable securing arrangements. End portion 45a may be secured within a blind recess or opening of similar dimensions in the base 16. End portion 45b may be secured in a blind recess or an opening of similar dimensions in the coupling element 32. The piezoceramic material layers 44 and 46 may vary in width, length and thickness, but in one form each has a length of about 0.5 inch-2.5 inch (12.7 mm-63.5 mm), a width of between about 0.2 inch-0.75 inch (5.08 mm-19.05 mm), and a thickness of about 0.02 inch-0.005 inch (0.508 mm-0.127 mm). The support substrate 42 typically will have dimensions similar to those of the piezoceramic material layers 44 and 46. In one example, the support substrate 42 has a thickness of about 0.002 inch-0.015 inch (0.0508 mm-0.381 mm), a width that is approximately equal to the width of each piezoceramic material layer 44,46 and a length that is approximately equal to that of each of the layers 44,46.

With further reference to FIG. 3, the mass component 18 may comprise a variety of shapes and configurations. Thus, it will be appreciated that the particular configuration illustrated in FIG. 3 is strictly exemplary. The mass component 18 may be made from aluminum, steel or any other suitable material having dimensions and a mass that is suitable to produce a twisting moment at the upper ends 12b and 14b of the flexible beams 12 and 14 in response to vibration of the structure 38. In this regard it will be appreciated that the precise dimensions and material selected for the mass component 18 may depend in part on the expected amplitude and frequency of the vibration energy that is expected to be experienced by the apparatus 10. Also, the length of the links 22 and 24 is selected such that the mass component 18 is suspended above an upper surface 16a of the base to enable motion of the mass component 18 in both directions along a vertical axis represented by arrow 50 in FIG. 3. The overall mass of the mass component 18, however, in this example, may be such that it is suspended without causing flexing of the flexible beams 12 and 14 while no vibration is being experienced by the apparatus 10.

Referring to FIGS. 5 and 6, the operation of the apparatus 10 will now be described. Referring first to FIG. 5, when the base 16 experiences a vibration force in the direction of arrow 52, the mass of the mass component 18 causes it to tend to remain stationary as the base 16 moves downwardly. The effect is that the base 16 moves downwardly away from the mass component 18, relatively speaking, which causes the rigid links 22 and 24 to exert a twisting moment at the upper end 12b of the flexible beam 12 and the upper end 14b of the flexible beam 14. The twisting moment applied to flexible beam 12 is applied by the coupling element 32, while the twisting moment to flexible beam 14 is applied by coupling element 36. The flexures 26, 28, 30 and 34 flex slightly as needed during this upward. motion of the mass component 18 relative to the base 16. Electrical signals are generated by the flexible beams 12,14 as the beams flex and the signals are output to the signal conditioning subsystem 17. The signal conditioning subsystem 17 can be tailored to produce an electrical output that can be used as needed to either power other electromechanical or electronic devices, or to provide electrical signals to control such devices.

Figure 7:
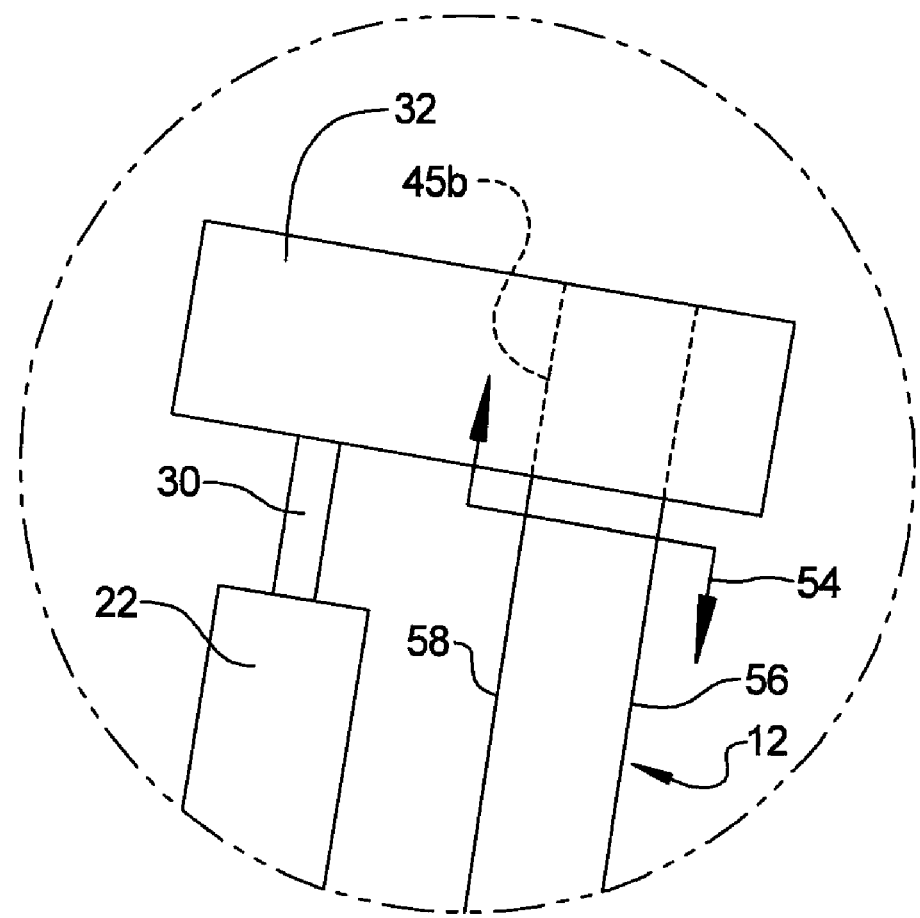
FIG. 7 is an enlarged side view of one of the flexible beams of FIG. 5 illustrating schematically the moment arm that produces a twisting action at the free end of the flexible beam.

With brief reference to FIG. 7, the twisting moment applied to the upper end 12b of flexible beam 12 is shown diagrammatically by line 54. The coupling element 32 effectively applies a downwardly directed moment at an outer surface 56 of the flexible beam 12, while an upwardly directed moment is applied at the inner surface 58 of the flexible beam 12. This causes the piezoceramic material layers 44 and 46 to experience changing levels of stress and/or strain and to each generate electric output signals that are input to the signal conditioning subsystem 17.

Figure 2:
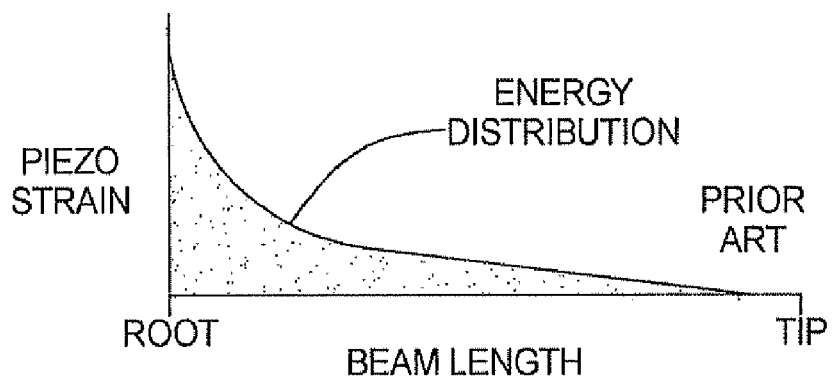
FIG. 2 is a graph of the piezoceramic energy distribution of the beam of FIG. 1.
Figure 8:
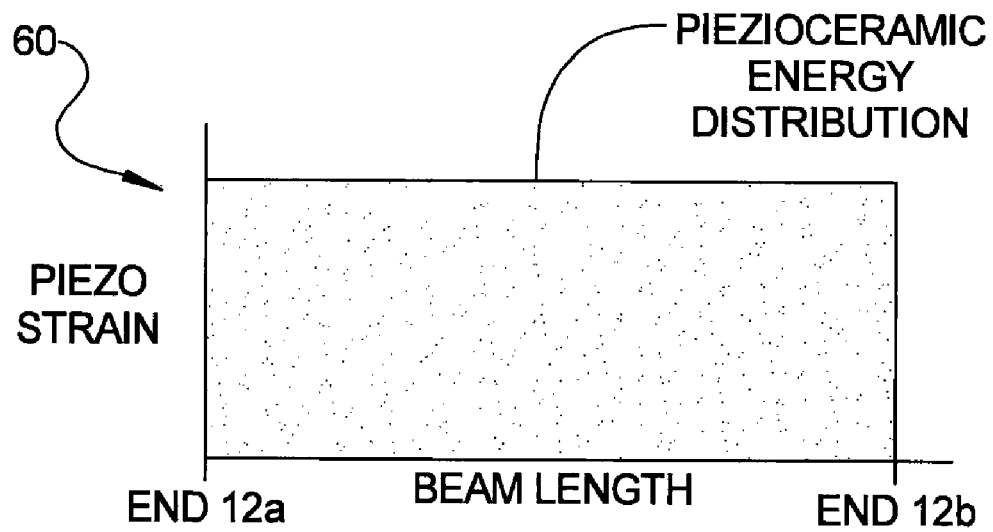
FIG. 8 is a graph of the substantially linear piezoceramic energy distribution across the length of one of the flexible beams of the apparatus of FIG. 3.

The twisting moment produced at the upper end 12b, 14b of each of the flexible beams 12,14 provides a significant advantage in that the stress and/or strain experienced by each of the beams 12,14 is applied more evenly and uniformly across the full length of the beams 12,14. With brief reference to FIG. 8, a graph 60 illustrates the linear piezoceramic energy distribution over the length of the flexible beam 12. This illustrates that the stress and strain experienced by the flexible beam 12 is distributed uniformly along the entire length of the flexible beam 12. This is in significant contrast to the piezoceramic energy distribution of FIG. 2 for a conventional cantilever beam, where the beam experiences a force at its outermost tip that is directed perpendicular to the beam's longitudinal axis. Thus, the output of the piezoceramic material layers 44 and 46 of each of the flexible beams 12,14 is significantly enhanced by the twisting moment applied at the end of each beam 12,14.

Referring now to FIG. 6, as the base 16 experiences a vibration force in the direction of arrow 66, the mass of the mass component 18 tends to hold the mass component 18 stationary. This effectively causes the mass component 18 to move towards the base 16, relatively speaking. This in turn causes the rigid links 22 and 24 to pull downwardly, thus flexing the flexible beams 12 and 14 inwardly towards one another. This causes twisting moments at the upper end 12b of flexible beam 12 and at the upper end 14b of flexible beam 14, with the twisting moments being directed essentially opposite to those produced during the flexing motion of the flexible beams 12,14 as shown in FIG. 5. Again, the piezoceramic material layers 44, 46 associated with each flexible beam 12,14 experience changing stresses and/or strains during this flexing motion and generate electrical output signals in response thereto that track the flexing action. This flexing motion of the beams 12,14 alternates between the flexing motions depicted in FIGS. 5 and 6 as the base 16 experiences oscillating vibration energy from the structure 38.

Figure 9:
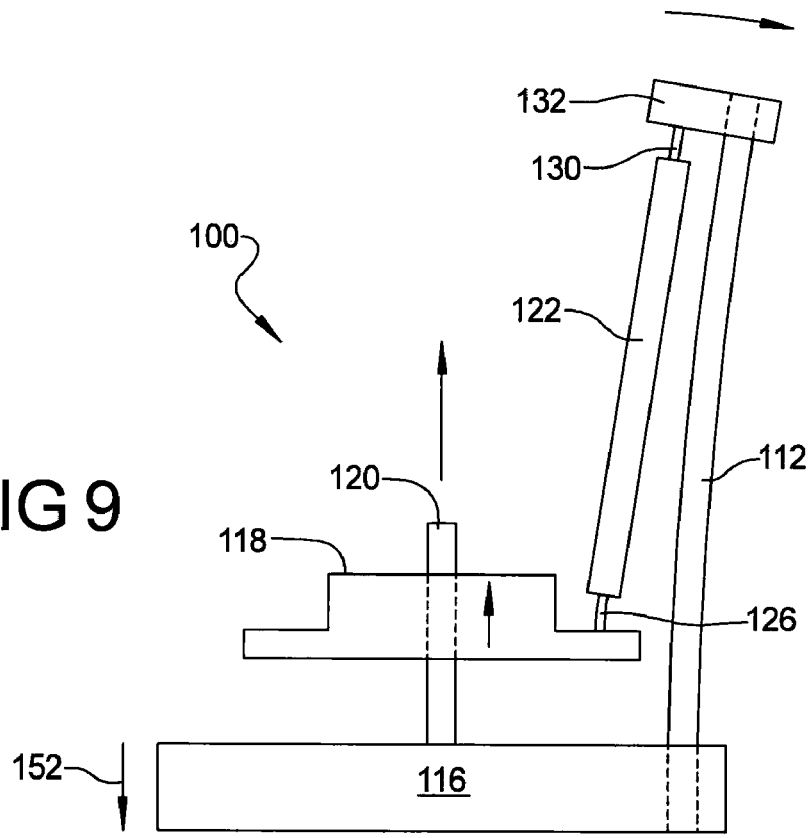
FIG. 9 is a view of another embodiment of the apparatus of the present disclosure, but incorporating only a single flexible beam that is being flexed outwardly during upward motion of a mass component.
Figure 10:
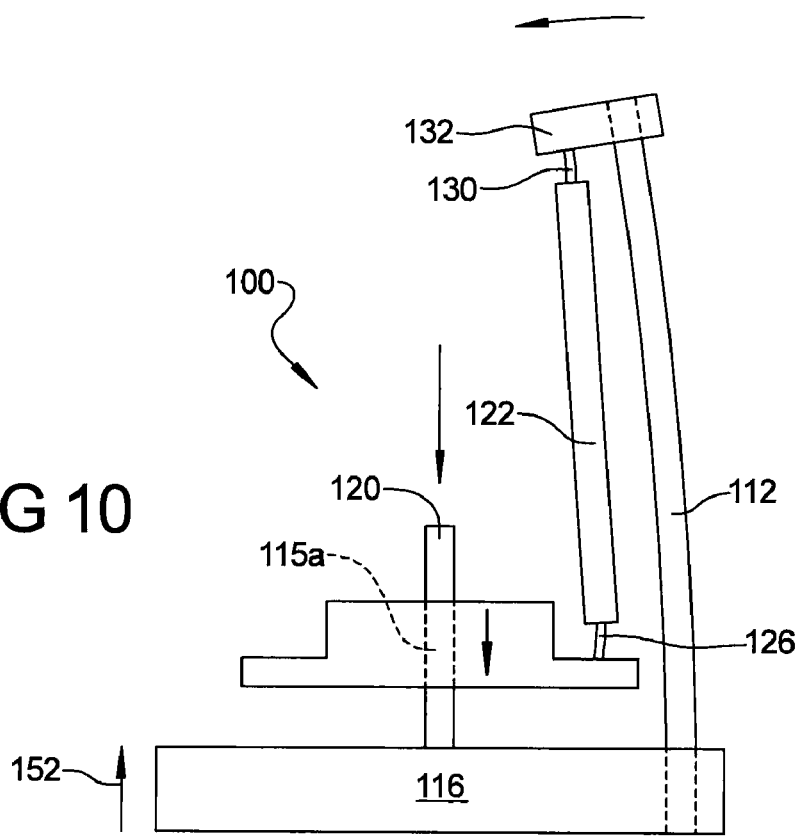
FIG. 10 is a side view of the apparatus of FIG. 9, but with the flexible beam flexing in the opposite direction in response to downward motion of the mass component.

Referring now to FIGS. 9 and 10, another embodiment 100 in accordance with the present disclosure is illustrated. The apparatus 100 is similar to apparatus 10 but instead makes use of only a single flexible beam and a single rigid link, rather than a pair of flexible beams and a pair of rigid links as with the apparatus 10. Components of the apparatus 100 in common with those described in connection with apparatus 10 are designated by reference numbers increased by 100 over those used in connection with the description of apparatus 10. Thus, component 126 corresponds to component 26, component 130 corresponds to component 30 and component 132 corresponds to component 32. Vibration energy directed in accordance with arrow 152 causes a flexing of a flexible beam 112 of the apparatus 100 as a mass component 118 moves upwardly away from a base 116 of the apparatus 100. In FIG. 10, vibration energy in the direction of arrow 152 effectively causes the mass component 118 to move towards the base 116 causing flexing of the flexible beam 112 in a direction opposite to that shown in FIG. 9. With the apparatus 100, it will be appreciated that since no counteracting force is present on the side of the mass component 118 opposite to that where the rigid link 122 is attached, a suitable bearing assembly may be required at the interface of the guide rod 120 and a bore 115a of a mass component 118 to handle the lateral loads that will be experienced during flexing of the flexible beam 112.

Figure 11:
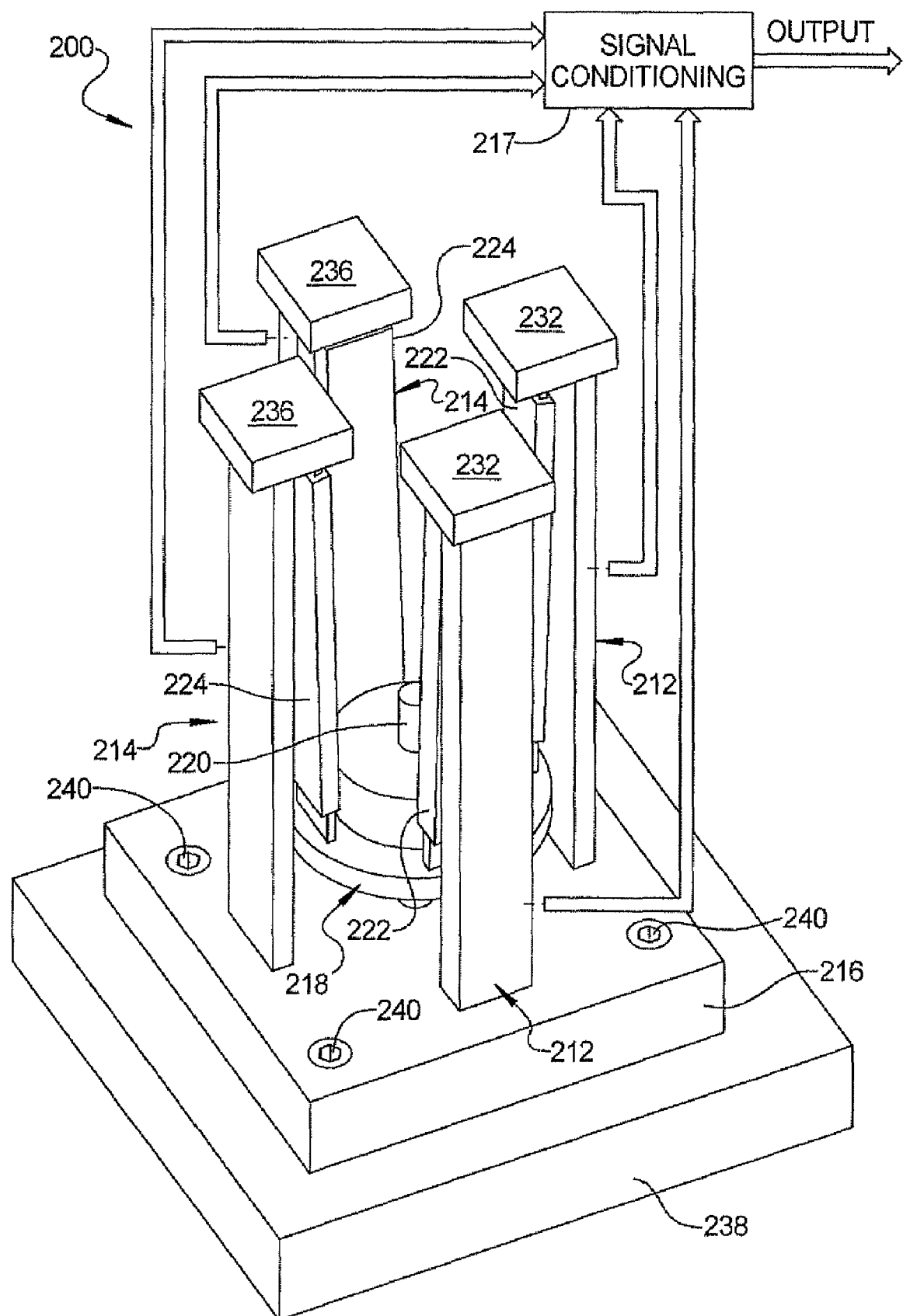
FIG. 11 is a perspective view of another energy harvesting apparatus that makes use of four flexible beams for generating electrical signals simultaneously in response to movement of a mass component.

Referring now to FIG. 11, an apparatus 200 in accordance with another embodiment of the present disclosure is illustrated. The apparatus 200 is similar to apparatus 10 but includes four flexible beams rather than two. Components in common with the apparatus 10 are designated by reference numbers in FIG. 11 increased by 200 over those used to describe the apparatus 10. Thus, component 216 corresponds to component 16, component 217 corresponds to component 17, component 218 corresponds to component 18, component 220 corresponds to component 20, component 232 corresponds to component 32, component 236 corresponds to component 36, component 238 corresponds to component 38, and component 240 corresponds to component 40. In this example, essentially a pair of flexible beams 212 and a pair of flexible beams 214 are incorporated, together with corresponding pairs of rigid links 222 and 224. The apparatus 200 otherwise operates identically to apparatus 10, but can be expected to provide essentially double the electrical output provided by the apparatus 10. From FIG. 11 it will be appreciated that virtually any number of flexible beams could be incorporated, depending upon the required electrical output, the expected amount of vibration energy, and other factors relating to a specific application.

The various embodiments described herein all enable vibration energy to be harvested and used to produce electrical energy. The various embodiments are expected to find particular utility in those applications where it would be difficult or impossible to route conductors to a remotely located sensor or other form of component that experiences vibration, in order to power such a sensor or component. In such applications, locating one of the embodiments of a vibration energy harvesting apparatus as described herein in proximity to the sensor or component would enable the apparatus to provide power to the sensor or component, thus eliminating the need to run electrical conductors to the remotely located sensor or component.

Further areas of applicability will become apparent from the description provided herein. It should be understood that the description and specific examples are intended for purposes of illustration only and are not intended to limit the scope of the present disclosure.

What is claimed is:

1. An energy harvesting apparatus, comprising:
   a flexible beam for generating electrical signals in response to at least one of stress and strain experienced by said flexible beam as said beam flexes;
   said flexible beam having a first end fixedly supported against movement, and a second end able to move to enable flexing of said flexible beam; and
   a moment generating subsystem in communication with said second end for generating a twisting moment on said second end of said flexible beam in response to vibration energy, said twisting moment causing a generally uniform application of at least one of stress and strain over substantially a full length of said flexible beam; and
   said moment generating subsystem including:
      a mass component supported for movement along a path that is offset from a longitudinal axis of said flexible beam, and generally parallel to a longitudinal axis of said flexible beam; and
      a link for transmitting motion of said mass component to said flexible beam.

2. The apparatus of claim 1, wherein said flexible beam includes a piezoelectric material layer for generating said electrical signals.

3. An energy harvesting apparatus, comprising:
   a flexible beam for generating electrical signals in response to at least one of stress and strain experienced by said flexible beam as said beam flexes;
   said flexible beam having a first end fixedly supported against movement, and a second end able to move to enable flexing of said flexible beam;
   a mass component in communication with said second end of said flexible beam and supported for movement along a path that is offset from a longitudinal axis of said flexible beam, and generally parallel to a direction of vibration energy to be harvested, and generally parallel to said flexible beam;
   a link for coupling said mass component to said second end of said flexible beam; and
   said mass component being responsive to said vibration energy experienced by an external structure on which said apparatus is supported, to cause flexing of said flexible beam in response to said vibration energy, and generation of said electrical signals by said flexure beam.

4. The apparatus of claim 3, said link comprising first and second opposing ends each including a flexure component, one of said flexure components coupling said first end of said link to said mass component and the other one of said flexure components coupling said second end of said link to said second end of said flexible beam.

5. The apparatus of claim 4, further comprising a base for supporting said first end of said flexible beam and for guiding movement of said mass component along a generally linear path.

6. The apparatus of claim 3, further comprising an additional flexible beam for generating electrical signals in response to said vibration energy, and disposed laterally adjacent said flexible beam and in communication with said mass component, for flexing in response to movement of said mass component.

7. The apparatus of claim 3, wherein said flexible beam comprises a piezoelectric material.

8. The apparatus of claim 3, wherein said flexible beam comprises a flexible substrate having a piezoelectric material layer thereon.

9. The apparatus of claim 3, wherein said flexible beam comprises a flexible substrate having a pair of piezoelectric material layers disposed on opposing surfaces of said flexible substrate.

10. A method for harvesting vibration energy, comprising:
    supporting a flexible beam fixedly at a first end from a support structure, the flexible beam being operable to generate electrical signals in response to flexing thereof;
    disposing a mass component for movement along a path at least substantially parallel to a longitudinal axis of said flexible beam, and at least substantially parallel to a path along which vibration energy is being directed;
    using a generally linear motion of said mass component generated in response to said vibration energy to transmit said vibration energy to said flexible beam at a second end of flexible beam, to thus cause flexing of said flexible beam; and
    using flexing of said flexible beam to generate electrical signals.

11. The method of claim 10, wherein using a generally linear motion of said mass component comprises using a generally linear oscillating motion of said mass component to cause an oscillating flexing motion of said flexible beam.

12. The method of claim 11, wherein using a generally linear oscillating motion of said mass component comprises using a generally linear oscillating motion of said mass component that is applied to said flexible beam along a path that is generally perpendicular to said motion of said mass component.

* * * * *